United States Patent [19]

Kuyk et al.

[11] Patent Number: 4,998,153
[45] Date of Patent: Mar. 5, 1991

[54] CHARGE-COUPLED DEVICE

[75] Inventors: Karel E. Kuyk; Jan W. Slotboom; Geert J. T. Davids; Wiegert Wiertsema; Arie Slob, all of Eindhoven, Netherlands

[73] Assignee: U.S. Philips Corp., New York, N.Y.

[21] Appl. No.: 263,662

[22] Filed: Oct. 27, 1988

[30] Foreign Application Priority Data

Oct. 28, 1987 [GB] United Kingdom ............... 8725255

[51] Int. Cl.$^5$ ................. H01L 29/78; H01L 27/14; H01L 31/00
[52] U.S. Cl. ..................... 357/24; 357/30; 377/61; 377/62; 377/63; 358/213.22; 358/213.23
[58] Field of Search ............. 357/24, 24 LR, 24 M, 357/30 D, 30 H; 377/61, 62, 63; 358/213.22, 213.23

[56] References Cited

U.S. PATENT DOCUMENTS 3,967,254  6/1976  Kosonocky et al. ............ 357/24
4,131,950 12/1978  Van Santen ................... 357/24 LR
4,669,100  5/1987  Slotboom et al. ............. 357/24
4,777,519 10/1988  Oshima ...................... 357/24 M Primary Examiner—Andrew J. James
Assistant Examiner—Ngan Van Ngo
Attorney, Agent, or Firm—Steven R. Biren

[57] ABSTRACT

A first charge storage electrode (21) has a first row (21b) of teeth interdigitated with a second row (22b) of teeth of a second charge storage electrode (22). The second storage electrode (22) has a third row (22c) of teeth interdigitated with a fourth row (23b) of teeth of a third charge storage electrode (23). The first and third rows (21b and 22c) overlie one group (11b) of a series of parallel conduction channels while the second and fourth rows (22b and 23b) overlie another group (11a) of the parallel channels. A first charge transfer electrode (24) is provided to transfer charge packets into sites beneath the first storage electrode. Second, third, fourth and fifth charge transfer electrodes (25, 26, 27 and 28) are provided to transfer charge packets between sites beneath, respectively, the first storage electrode (21) and the second row (22b), the first row (21b) and the second storage electrode (22), the second storage electrode (22) and the fourth row (23b), and the third row (22c) and the third storage electrode (23). The first, second and third storage and associated transfer electrodes may form an output stage (20) of a parallel register (C) of a series-parallel-series device to enable de-interlacing of rows of information.

7 Claims, 6 Drawing Sheets

CHARGE-COUPLED DEVICE

BACKGROUND OF THE INVENTION

This invention relates to a charge-coupled device which is particularly suited for use as an output stage of a serial-parallel-serial (SPS) charge-coupled device memory.

An SPS memory has series input and output registers each consisting of a charge conduction channel across which extends, alternately, charge storage and charge transfer electrodes for enabling charge packets to be transported along the channel. Between the series registers is provided a parallel section or register which has a number of parallel channels across which extend alternate charge storage and charge transfer electrodes. Each charge storage electrode of the parallel register is arranged to define with the underlying channels a row of charge storage sites for storing information transferred to the parallel register from the series input register. As alternate charge storage sites of the series registers are empty when a row of information has been input to the series register, a technique called "interlacing" is used to enable full use of the storage space in the parallel register. Thus, after one subsidiary row of information has been transferred to the parallel register from the series register so that only alternate charge storage sites of the first row of the parallel register are occupied another subsidiary row of information is input to the series input register and then transferred to the parallel register so as to occupy the remaining charge storage sites of the first row. Thus the two subsidiary rows of information are interlaced.

In order that the information be output in the same order in which it was input to the memory, a technique for de-interlacing the interlaced subsidiary rows is required so that the one subsidiary row can be output via the output series register followed by the other subsidiary row.

U.S. application Ser. No. 3967254 describes such a technique for effecting de-interlacing in which the parallel register has an output stage or structure consisting of first and second charge storage electrodes having respectively first and second rows of teeth which are interdigitated so that the teeth of the first row lie over respective ones of the one subsidiary group of channels and the teeth of the second row lie over respective ones of the other subsidiary group of channels.

A first charge transfer electrode of the output stage is provided to transfer a row of information from the row of charge storage sites beneath the preceding charge storage electrode of the parallel section into a row of charge storage sites beneath the first charge storage electrode. A second charge transfer electrode is provided for transferring charge packets between charge storage sites beneath portions of the first charge storage electrode between the first row of teeth and charge storage sites beneath the second row of teeth while a third charge transfer electrode is provided for transferring charge packets between charge storage sites beneath the first row of teeth and the portions of the second charge storage electrode between the teeth of the second row.

By supplying appropriate clock signals to clock lines controlling the first and second charge storage electrodes the subsidiary rows of information can be separated so that, for example, the subsidiary row of information stored at charge storage sites beneath the teeth of the first row can be transferred to charge storage sites beneath the second charge storage electrode and then output via a transfer gate and series output register while the other subsidiary row remains stored at charge storage sites under the intervening portions of the first charge storage electrode to be output subsequently.

Although the output stage described in U.S. application Ser. No. 3967254 enables the required separation of subsidiary rows of information where a drop-clock scheme of clocking pulses is used, if it is desired to use a push-clock scheme of clocking pulses the output stage described in U.S. application Ser. No. 3967254 is not acceptable because it would be impossible to apply a clocking signal to the first charge storage electrode of the output stage which would cause charge packets stored under, for example, the teeth of the first row to be pushed (with the appropriate clock signal applied to the third charge transfer electrode), into potential wells formed at charge storage sites beneath the second charge storage electrode while still maintaining potential wells for the remaining subsidiary row of information at charge storage sites beneath the intervening portions of the first charge storage electrode.

SUMMARY OF THE INVENTION

According to a first aspect of the present invention, there is provided a charge-coupled device comprising a semiconductor body defining a series of parallel charge conduction channels, charge storage electrodes extending across the channels so that each charge storage electrode defines with the channels a respective row of charge storage sites, and charge transfer electrodes extending across the channels for transferring charge packets between rows of charge storage sites, which device comprises a first charge storage electrode having a first row of teeth overlying one subsidiary group of the channels, a second charge storage electrode having second and third rows of teeth, the second row being interdigitated with the first row so as to overlie another subsidiary group of the channels, a third charge storage electrode having a fourth row of teeth interdigitated with the third row, one of the third and fourth rows of teeth overlying the said one subsidiary group of channels and the other of the third and fourth rows of teeth overlying the said other subsidiary groups of channels, a first charge transfer electrode for transferring charge packets to the row of charge storage sites defined by the channels and the first charge storage electrode, a second charge transfer electrode for transferring charge packets between charge storage sites beneath the first charge storage electrode and charge storage sites beneath the second row of teeth, a third charge transfer electrode for transferring charge packets between charge storage sites beneath the first row of teeth and charge storage sites beneath the second charge storage electrode, a fourth charge transfer electrode for transferring charge packets between charge storage sites beneath the second charge storage electrodes and charge storage sites beneath the fourth row of teeth and a fifth charge transfer electrode for transferring charge packets between charge storage sites beneath the third row of teeth and charge storage sites beneath the third charge storage electrode.

A charge-coupled device embodying the invention enables information stored in potential wells formed at charge storage sites beneath the first row of teeth to be separated from information stored in potential wells formed at charge storage sites beneath the intervening portions of the first charge storage electrode even where a push-clock scheme of clocking pulses is to be used.

The third row of teeth may be offset from the second row of teeth so that the teeth of the third row overlie the said one subsidiary group of channels and the teeth of the fourth row overlie the said other subsidiary group of channels. This enables the maximum length of a charge storage electrode along a channel to be kept to a minimum. However, where this is not important the third row could be aligned with the second and the fourth with the first row of teeth.

Each tooth generally overlies a single channel although there may be circumstances where it is desirable for a single tooth to overlie two or more adjacent channels. Usually, the said one subsidiary group of channels is formed by alternate ones of the channels and the said other subsidiary group of channels by the remaining channels.

Although a charge-coupled device embodying the invention may be used in any circumstances where it is desired to separate subsidiary rows of information, the charge-coupled device preferably comprises a parallel register defined by the channels and charge storage and transfer electrodes extending transversely over the channels and a series output register comprising a further channel and further charge storage and transfer electrodes, each further charge storage electrode of the series output register being associated with a channel of the parallel register, wherein the first, second and third charge storage electrodes and associated charge transfer electrodes form an output stage of the parallel register, an output transfer gate being provided for transferring charge packets from potential wells beneath the third charge storage electrode to the series output register and preferably also comprises a series input register having a channel and associated charge storage and transfer electrodes, each charge storage electrode of the series input register being associated with a channel of the parallel register, and an input transfer gate for transferring charge packets from the series input register to the parallel register. The series output register or each of the series input and output registers may be a four-phase register.

The present invention also provides a method of operating a charge-coupled device in accordance with the first aspect, which method comprises storing a row of charge packets in potential wells formed at the row of charge storage sites defined by the first charge storage electrode, causing the row of charge packets to be transferred to potential wells at charge storage sites defined by the second charge storage electrode and causing the charge packets stored in the potential wells beneath the second charge storage electrode to move while applying charge transfer blocking signals to one of the third and second and to one of the fourth and fifth charge transfer electrodes so that charge transfer blocking signals are applied either to the third and fourth or the second and fifth charge transfer electrodes so that charge packets stored at charge storage sites defined by the said one subsidiary group of channels move from potential wells beneath the second charge storage electrode to potential wells beneath one of the first and third charge storage electrodes while charge packets stored in charge storage sites defined by the said other subsidiary group of channels move from potential wells beneath the second charge storage electrode to potential wells beneath the other of the first and third charge storage electrodes thereby separating the row of charge packets into first and second subsidiary rows.

The charge packets may be moved by a push-clock sequence of clock signals applied to the charge storage and transfer electrodes although other suitable clocking arrangements could be used.

A method embodying the invention may comprise causing the row of charge packets to be transferred to potential wells beneath the second charge storage electrode by applying charge transfer enabling signals to the second and third charge transfer electrodes and then, with a charge storage enabling signal applied to the second charge storage electrode, applying a charge storage blocking signal to the first charge storage electrode to push the charge packets out of the charge storage sites defined by the first charge storage electrode.

In one arrangement, the step of causing the row of charge packets to be transferred to potential wells beneath the second charge storage electrode may comprise applying charge transfer blocking signals to the second and third charge transfer electrodes after applying the charge storage blocking signal to the first charge storage electrode so as to push the row of charge packets into potential wells beneath only the second charge storage electrode and the same control signals may be applied to the second and fifth charge transfer electrodes and/or to the third and fourth charge transfer electrodes.

In another arrangement, the step of causing the row of charge packets to be transferred to potential wells beneath the second charge storage electrode may comprise applying a charge transfer enabling signal to the other of the fourth and fifth charge transfer electrodes and a charge storage enabling signal to the third charge storage electrode before applying the charge storage blocking signal to the first charge storage electrode and the same control signals may be applied to the other of the third and second as to the other of the fourth and fifth charge storage electrodes.

The charge packets stored at charge storage sites defined by the second charge storage electrode may be caused to move by applying charge transfer blocking signals to the said one of the third and second and to the said one of the fourth and fifth charge transfer electrodes while applying charge transfer enabling signals to the other of the third and second and to the other of the fourth and fifth charge transfer electrodes and charge storage enabling signals to the first and third charge storage electrodes, and applying a charge storage blocking signal to the second charge storage electrode to push the charge packets of the first and second subsidiary rows in opposite directions out of the charge storage sites defined by the second charge storage electrode.

In the one arrangement, the charge packets stored at charge storage sites defined by the second charge storage electrode may be caused to move by, while applying charge transfer blocking signals to the said one of the third and second and to the said one of the fourth and fifth charge transfer electrodes, applying charge storage enabling signals to the first and third charge storage electrodes at the same time as applying charge transfer enabling signals to the other of the third and second and to the other of the fourth and fifth charge transfer electrodes, and then applying a charge storage blocking signal to the second charge storage electrode to push the charge packets of the first and second subsidiary rows in opposite directions out of the charge storage sites defined by the second charge storage electrode.

A method embodying the invention may comprise, after applying the charge storage blocking signal to the second charge storage electrode, applying charge transfer blocking signals to the said other of the third and second and to the said other of the fourth and fifth charge transfer electrodes to push the charge packets of the first and second subsidiary rows further in the said opposite directions so that the charge packets of one of the first and second subsidiary rows are pushed into potential wells beneath only the first charge storage electrode and the charge packets of the other of the first and second subsidiary rows are pushed into potential wells beneath only the third charge storage electrode.

After separating the row of charge packets into first and second subsidiary rows, a method embodying the invention may comprise outputting the charge packets stored in potential wells beneath the third charge storage electrode of the subsidiary row and then subsequently moving the charge packets of the other subsidiary row stored in potential wells beneath the first charge storage electrode to potential wells beneath the third charge storage electrodes and then outputting the charge packets of the other subsidiary row.

For example, the charge packets of the other subsidiary row may be transferred from potential wells beneath the first charge storage electrode to potential wells beneath the third charge storage electrode for output by, with a charge storage enabling signal applied to the second charge storage electrode, applying a charge transfer enabling signal to the other of the third and second charge transfer electrodes, then applying a charge storage blocking signal to the first charge storage electrode and subsequently to the said other of the third and second charge transfer electrodes to push the charge packets of the other subsidiary row into potential wells beneath the second charge storage electrode, applying a charge transfer enabling signal to the other of the fourth and fifth charge transfer electrodes and a charge storage enabling signal to the third charge storage electrode and subsequently applying a charge storage blocking signal to the second charge storage electrode and then a charge transfer blocking signal to the said other of the fourth and fifth charge transfer electrodes to push the charge packets of the other subsidiary row into potential wells beneath only the third charge storage electrode.

As used herein, the term charge storage enabling signal means a voltage signal which provides a charge storage potential well beneath the charge storage electrode to which the voltage signal is applied while the term charge storage blocking signal means a signal of a voltage such that there is, or is no longer, a potential well in which charge can reside beneath the charge storage electrode to which the charge storage blocking signal is applied. Similarly, the term charge transfer enabling signal means a voltage signal which provides a potential well beneath the charge transfer electrode to which the signal is applied to enable transfer of a charge packet while the term charge transfer blocking signal means a signal of such a voltage that there is or is no longer a potential well in which charge can reside beneath the charge transfer electrode to which the charge transfer blocking signal is applied.

BRIEF DESCRIPTION OF THE DRAWINGS

Embodiments of the invention will now be described by way of example with reference to the accompanying drawings, in which:

FIG. 7b is a schematic representation of part of the output stage illustrating movement of charge packets under the control of the clock signals shown in FIG. 7a;

FIG. 8b is a schematic representation of part of the output stage illustrating movement of charge packets under the control of the clock signals shown in FIG. 8a;

FIG. 9b is a schematic representation of part of the output stage illustrating movement of charge packets under the control of the modified clock signal scheme shown in FIG. 9a.

Figure 1:
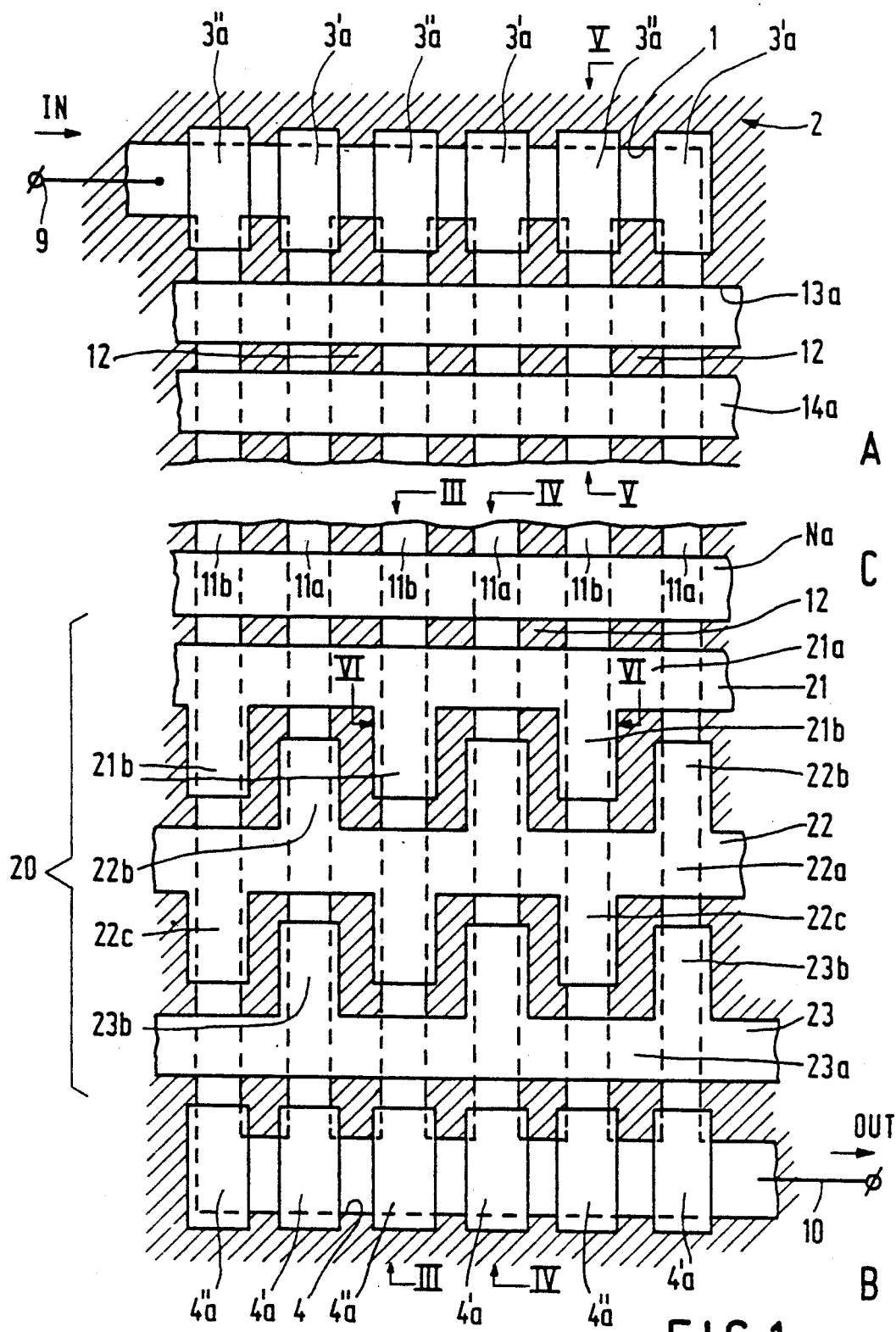
FIG. 1 is a schematic lay-out diagram of part of a serial-parallel-serial (SPS) memory device embodying the invention.

Referring to the drawings, it should first be noted that the Figures are diagrammatic and are not drawn to scale. In particular, certain relative dimensions, such as thickness, may have been exaggerated while other dimensions may have been reduced in the interests of clarity in the Figures.

DESCRIPTION OF THE PREFERRED EMBODIMENTS

FIG. 1 illustrates schematically a lay-out diagram of part of a memory block of a serial-parallel-serial (SPS) memory device which may comprise four or more such memory blocks connected in parallel.

Referring to FIGS. 1 to 6, a charge-coupled device embodying the invention comprises a series input register A, a parallel register C and a series output register B.

The series input register A comprises a channel 1 defined in a semiconductor body 30 by a part of a field oxide pattern 2, by an input transfer gate $T_1$ and by alternate charge transfer and storage electrodes $3b$ and $3a$ for enabling charge packets to be introduced into and stored in the series input register A from an input node 9 under the control of clock signals. As shown, the series input register A is a four-phase charge-coupled device structure and is controlled by clock signals $\phi_1{}^A$ to $\phi_4{}^A$ (FIG. 2).

The series output register B similarly comprises a channel 4 defined in the semiconductor body 30 by part of the field oxide pattern 2, by an output transfer gate $T_2$ and by alternate charge transfer and storage electrodes 4b and 4a. The output series register is also a four phase charge-coupled device structure and its operation is controlled by clock signals $\phi_1{}^B$ to $\phi_4{}^B$ (FIG. 2).

The input transfer gate $T_1$ (FIG. 2) is provided to transfer charge packets from the series input register A to the parallel register or section C.

Figure 2:
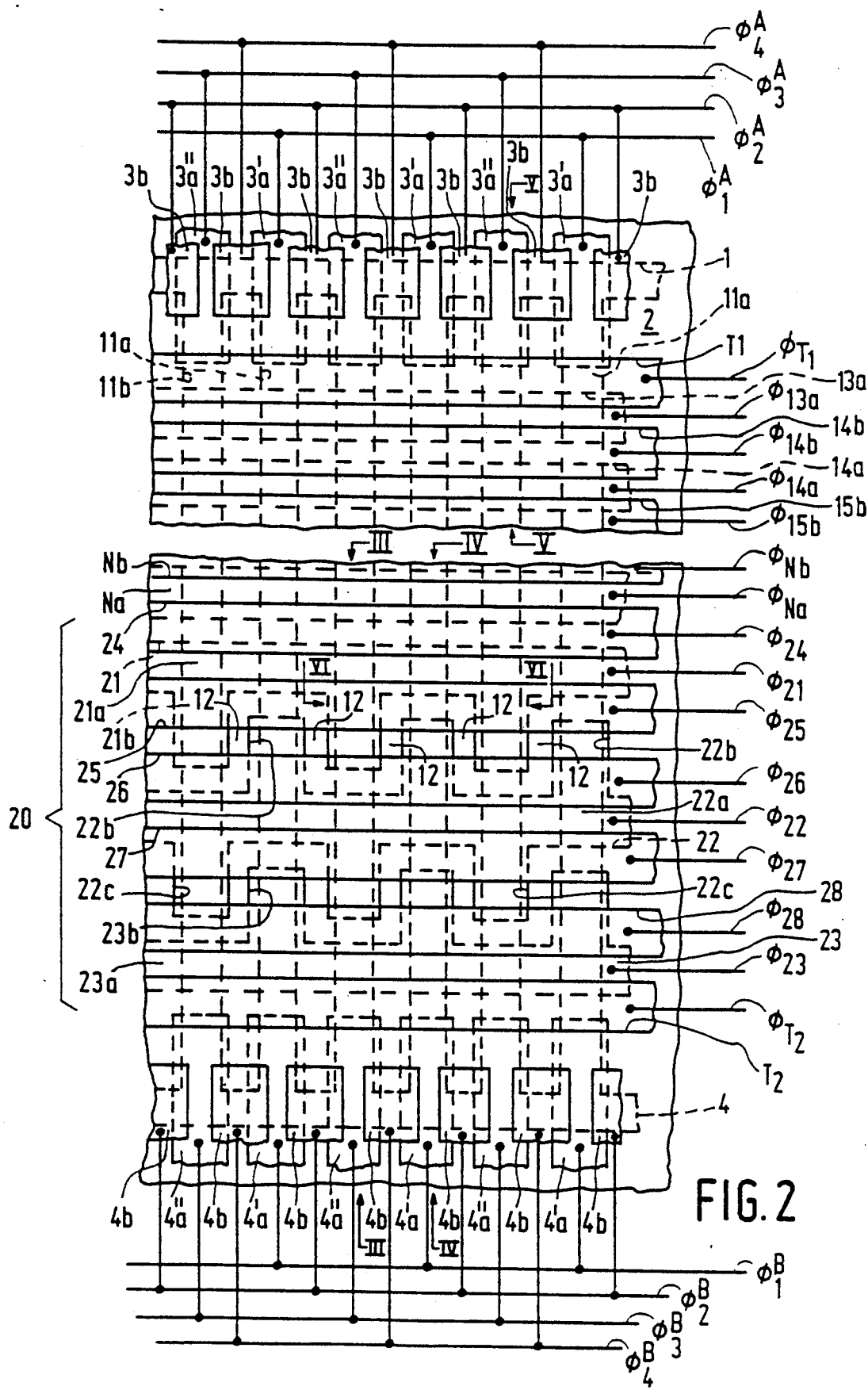
FIG. 2 is a plan view, in more detail and part cutaway, of part of the charge-coupled memory device shown in FIG. 1.
Figure 3:
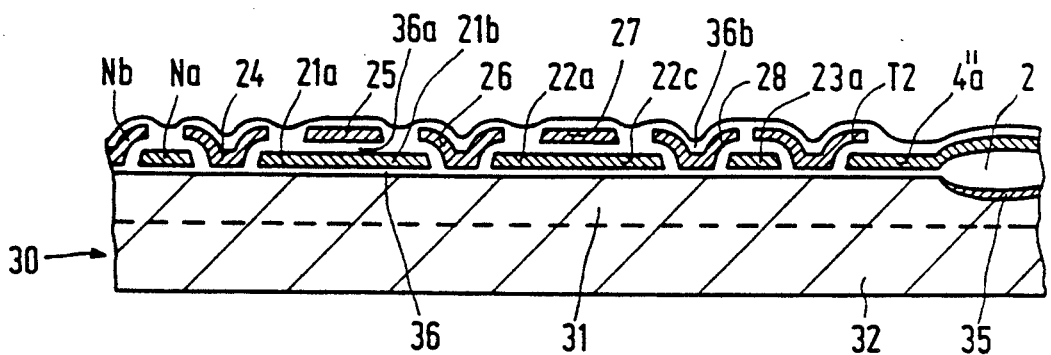
FIG. 3 is a cross-sectional view of the device shown in FIG. 2 taken along the line III—III in FIG. 2.
Figure 4:
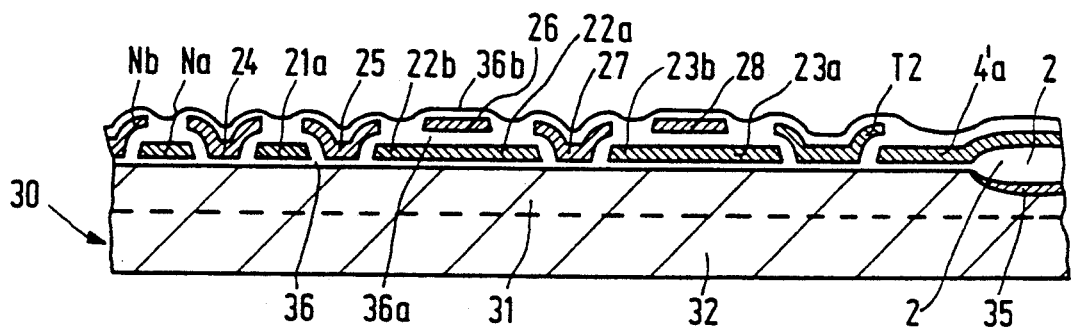
FIG. 4 is a cross-sectional view of the charge-coupled device shown in FIG. 2 taken along the line IV—IV in FIG. 2.
Figure 5:
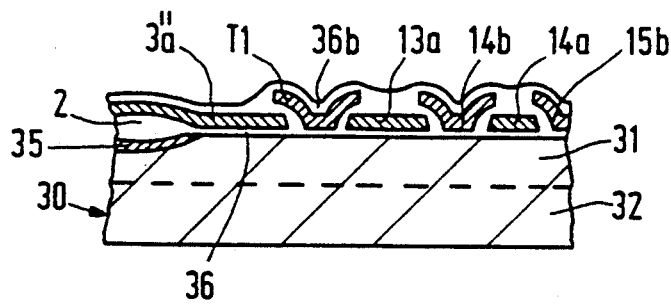
FIG. 5 is a cross-sectional view of the charge-coupled device shown in FIG. 2 taken along the line V—V in FIG. 2.
Figure 6:
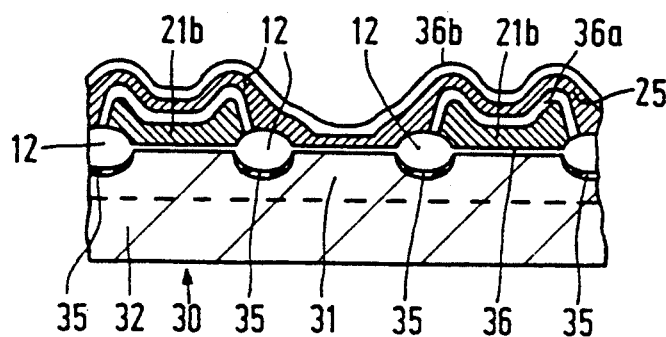
FIG. 6 is a cross-sectional view of the charge-coupled device of FIG. 1 taken along the line VI—VI in FIG. 2.

As shown most clearly in FIGS. 1 and 2, the parallel section C comprises a number (only six as shown in FIGS. 1 but there will in practice be many more) of parallel channels 11 defined by strips 12 of the field oxide pattern 2. Alternate charge transfer and storage electrodes extend transversely, as shown perpendicularly, over the channels 11. Each of the charge storage electrodes 13a . . . . Na defines with the channels 11 a row of charge storage sites extending transversely, as shown perpendicularly, of the channels 11, while the charge transfer electrodes 14b to Nb (associated with the charge storage electrodes 14a to Na, respectively) serve to transfer rows of charge packets row by row along the parallel section.

Although the clock lines for supplying signals for controlling the movement of charge packets from row to row through the parallel section C may provide a two, three or four phase system, preferably the parallel section C is controlled as a multi-phase or ripple system with, for example, every tenth charge transfer electrode and every tenth charge storage electrode of the parallel section C being connected to the same clock line so that, as described inter alia in GB-A-No. 2105111, nine out of ten successive storage rows are filled with information, while the tenth remains empty. By moving the empty place from the bottom to the top of the parallel register C information can be moved from the top to the bottom row by row. The advantage of this mode of operation is the high information density which can be obtained in the parallel section in that only one empty row occurs in every ten rows.

In order to optimize usage of the parallel section C, it is desirable that all the channels 11 be used to transport charge packets. As only alternate charge storage sites of the series registers A and B may be full at one time if two, three or four phase clocking is used, a technique known as interlacing is used.

Thus, a first subsidiary row of information is input as charge packets to the input series register A so as to be stored in potential wells formed by high clock signal voltages applied to the clock lines $\phi_1{}^A$ to $\phi_4{}^A$ at charge storage sites beneath alternate charge storage electrodes, that is either beneath charge storage electrodes 3'a or charge storage electrodes 3"a. This first subsidiary row is then transferred to potential wells formed at charge storage sites defined by the charge storage electrode 13a and either a first or a second subsidiary group of channels 11a or 11b. Where the first subsidiary row resides in the series register A in potential wells beneath the charge storage electrodes 3'a before transfer, then the first row will be transferred to potential wells at charge storage sites defined by the charge storage electrode 13a and the first subsidiary group of channels 11a, whereas if the first subsidiary row resides in potential wells beneath the charge storage electrodes 3"a in the input series register A, then the first subsidiary row will be transferred to potential wells at charge storage sites defined by the charge storage electrode 13a and the second subsidiary group of channels 11b.

A second subsidiary row of information is then input to the series input register A so as to fill potential wells at charge storage sites beneath the charge storage electrodes not previously occupied by the first subsidiary row immediately before transfer and transferred via the input transfer gate $T_1$ to lie in potential wells at charge storage sites defined by the remaining subsidiary group of channels and the charge storage electrode 13a. Where the first subsidiary row of information is transferred from potential wells beneath the charge storage electrodes 3'a to potential wells formed at charge storage sites defined by the first subsidiary group of channels 11a and the charge storage electrode 13a then the second subsidiary row of information will be transferred from potential wells beneath the charge storage electrodes 3"a to potential wells formed at charge storage sites defined by the second subsidiary group of channels 11b and the charge electrode 13a, and of course vice versa.

The first and second subsidiary rows of information are thus interlaced to form a row of information within the parallel section C which can then be transported in the usual manner using a multi-phase or ripple clock clocking system from row to row of charge storage sites towards the series output register B.

In order to output information from the memory block in the same order in which it was input, means are required for de-interlacing the rows of information. Thus, the parallel section C has a de-interlacing output stage 20 which enables a first subsidiary row of information to be transferred, via the output transfer gate $T_2$ and the series output register B, to an output node 10 followed by the associated second subsidiary row of information.

As shown most clearly in FIGS. 1 and 2, the de-interlacing output stage 20 of the parallel section C comprises three charge storage electrodes 21, 22 and 23 and five associated charge transfer electrodes 24, 25, 26, 27 and 28.

The first charge storage electrode 21 of the output stage 20 has a spine 21a extending transversely over the channels 11 and a first row of teeth 21b projecting from the spine 21a so that each tooth 21b lies over a respective channel 11. As shown each tooth 21b lies over a respective one of the second subsidiary group of channels 11b.

The second charge storage electrode 22 of the output stage 20 has a spine 22a and a second row of teeth 22b projecting from the spine 22a towards the first charge storage electrode 21 with the second row of teeth 22b offset from the first row of teeth 21b so as to lie over the first subsidiary group of channels 11a and so as to be interdigitated with the first row of teeth 21b.

A third row of teeth 22c extends from the spine 22a away from the first charge storage electrode 21 so as to be interdigitated with a fourth row of teeth 23b projecting from a spine 23a of the third charge storage electrode 23. As shown, the teeth of the third row 22c are offset from the teeth of the second row 22b so that the third and fourth rows of teeth 22c and 23b lie over the second and first subsidiary groups of channels, 11b and 11a respectively.

The first charge transfer electrode 24 of the output stage 20 is provided to transfer charge packets from the last row of the ripple-operated stage of the parallel section C to potential wells beneath the first charge storage electrode 21.

As indicated above, each charge transfer electrode 24 to 28 of the output stage 20 extends transversely, as shown perpendicularly, over the channels 11. In a direction along the channels 11, the second charge transfer electrode 25 is spaced from the first charge transfer electrode so as to overlap the spine 21a and extends along the channels 11 for a distance sufficient to overlap with ends of the teeth 22b while covering only part of the length of each tooth 21b. The third charge transfer electrode 26 is spaced from the second charge transfer electrode 25 so as to overlap ends of the teeth 21b and extends along the channels 11 over the teeth 22b so as to overlap the spine 22a. Similarly, the fourth charge transfer electrode 27 is spaced from the third charge transfer electrode 26 so as to overlap the spine 22a and extends along the channels 11 for a distance sufficient to overlap ends of the teeth 23b while only covering part of the length of the teeth 22c and the fifth charge transfer electrode 28 is spaced from the fourth charge transfer electrode 27 so as to overlap ends of the teeth 22c and extends along the channels 11 over the teeth 23b to overlap the spine 23a.

The output transfer gate $T_2$ serves to transfer charge packets into the series output register B from charge storage sites beneath the third charge storage electrode 23 of the output stage 20.

The structure of the charge-coupled device will now be described in more detail with reference to FIGS. 1, 2 and especially FIGS. 3 to 6.

The charge-coupled device comprises, as mentioned above, a semiconductor body 30, in this example a p-type semiconductor body of monocrystalline silicon. The semiconductor body 30 comprises at least a surface layer 31 having a comparatively low doping concentration of, for example, between $10^{15}$ and $10^{16}$ acceptor atoms per cm$^3$. The layer 31 may cover the whole thickness of the semiconductor body but alternatively may also be provided as a comparatively high-ohmic layer having a thickness between 5 and 15 μm on a low-ohmic p-type substrate 32 having a doping concentration of, for example, between $10^{18}$ and $10^{20}$ atoms per cm$^3$.

The channels 1, 4 and 11 are bounded and therefore defined by the field oxide pattern 2. The field oxide pattern 2 may also have openings outside the part shown in the Figures in places where peripheral circuits are provided. The field oxide pattern 2, the thickness of which may be, for example, between 0.3 and 0.7 μm is formed in the present embodiment by means of local oxidation of the silicon body. In order to prevent parasitic channel formation, the doping concentration below the oxide pattern 2 is increased by providing p-type channel stopper zones 35.

A thin dielectric layer, for example a silicon oxide layer 36 with a thickness of, for example, between approximately 0.02 and 0.05 μm, covers the surface of the semiconductor body 30 in the region of the channels 1, 4 and 11.

All of the charge storage electrodes are provided, in this embodiment, by depositing and patterning a first doped polycrystaline silicon layer on the dielectric layer 36. A further thin layer of dielectric material, again for example a silicon oxide layer 36a, covers the charge storage electrodes defined by the first polycrystalline silicon layer and a second doped polycrystalline silicon layer is deposited and patterned to provide all of the charge transfer electrodes plus the input and output transfer gates $T_1$ and $T_2$.

Further dielectric material, for example a further layer 36b of silicon dioxide, is provided over the second polycrystalline silicon layer and, after the necessary contact windows have been defined, conductive material, for example a metal such as aluminum, is deposited and patterned to provide conductive tracks for the necessary connections.

Although only one charge-coupled device or memory block is shown in the Figures, the complete memory device may consist of, for example, four such blocks with the charge storage and charge transfer electrodes for the parallel section C extending over all the blocks so that information can be transferred simultaneously from row to row in each memory block.

The operation of the device discussed above will now be briefly described.

As indicated above the series input and output registers A and B are four-phase charge-coupled device structures and are operated by a push-clock clocking scheme with, as is clear from FIGS. 3 to 6, the necessary directionality for causing charge packets to move in the required direction being provided by the clocking signals, there being no built in asymmetry.

Although, as will be appreciated, many rows of information will be input to and travel through the memory block, for simplicity's sake, the passage of a single row of information consisting of interlaced first and second subsidiary rows of information through the memory block will be described.

A first subsidiary row of information is input via the input node or diode 9 as charge packets which are moved, under the control of push-clock signals on the clock lines $\phi_1{}^A$ to $\phi_4{}^A$, into the series input register A until the potential wells formed at the charge storage sites beneath, in this example, alternate charge storage electrodes 3'a are occupied by data.

Considering a charge packet stored in a potential well beneath a charge storage electrode 3'a which is shown connected to clock line $\phi_1{}^A$, the sequence of clock signals proceeds as follows.

Initially the clock signals on clock lines $\phi_1{}^A$ and $\phi_3{}^A$ (connected to charge storage electrodes 3'a and 3"a, respectively) are high (that is charge storage enabling) so providing potential wells beneath the charge storage electrodes 3'a and 3"a, the potential well beneath the charge storage electrode 3'a of course containing the charge packet to be transferred. The clock signal on clock line $\phi_2{}^A$ is then raised high (that is charge transfer enabling) so connecting the potential wells beneath the charge storage electrode 3'a and the adjacent (on the right in FIGS. 1 and 2) charge storage electrode 3"a. The clock signal on clock line $\phi_1{}^A$ then goes low followed shortly after by the clock signal on clock line $\phi_2{}^A$ (that is charge storage blocking and charge transfer blocking signals, respectively are applied) so that the charge packet is pushed towards the right in FIGS. 1 and 2 first to lie in a potential well beneath the charge transfer electrode 3b and the adjacent (on the right in FIGS. 1 and 2) charge storage electrode 3"a and then to lie in a potential well defined only beneath the charge storage electrode 3"a.

The clock signal on clock line $\phi_1{}^A$ goes high (providing a potential well beneath the charge storage electrode 3'a ready for the next charge packet) shortly after the clock signal on clock line $\phi_2{}^A$ goes low, the clock signal on clock line $\phi_2{}^A$ providing a barrier to charge returning to the thus-formed potential well at the charge storage site beneath the charge storage electrode 3'a.

The clock signal on clock line $\phi_4{}^A$ then goes high enabling the charge packet to spread out into a potential well extending under the charge storage electrode 3"a, the intermediate charge transfer electrode 3b and the next (on the right in FIGS. 1 and 2) charge storage electrode 3'a and subsequently first the clock signal on clock line $\phi_3{}^A$ and then that on clock line $\phi_4{}^A$ go low to push the charge packet towards the right in FIGS. 1 and 2 into a potential well beneath only the said next (on the right in FIGS. 1 and 2) charge storage electrode 3'a. The clock signal on line $\phi_3{}^A$ goes high shortly after the clock signal on clock line $\phi_4{}^A$ goes low, the clock signal on clock line $\phi_4{}^A$ providing a barrier to back flow of charge. The above described process is repeated until a first subsidiary row of information is clocked into the series input register A.

When the potential well beneath each charge storage electrode 3'a contains a charge packet so that the first subsidiary row is stored within the series input register A, a high clock signal is applied to the input transfer gate clock line $\phi_{T1}$ enabling the charge packets to spread out into potential wells extending beneath the input transfer gate T$_1$ and the charge storage electrode 13a, the clock signal on clock line $\phi_{13a}$ being high. Again by a push-clock operation, i.e. lowering sequentially the voltage on clock line $\phi_1{}^A$ and then on clock line $\phi_{T1}$, the charge packets of the first subsidiary row are pushed into potential wells formed at charge storage sites defined by the channels 11a and the charge storage electrode 13a.

After the clock signal on clock line $\phi_{T1}$ has again gone low, a second subsidiary row of information is clocked into the series input register A in a manner similar to that described above except that the clock signals on clock lines $\phi_1{}^A$ to $\phi_4{}^A$ and the input transfer gate clock signal on clock line $\phi_{T1}$ cooperate to transfer charge packets into the parallel register C when potential wells formed at charge storage sites beneath the charge storage electrodes 3"a are occupied so that, when transferred to the parallel section C, the second subsidiary row of information lies in potential wells at charge storage sites defined by the channels 11b and charge storage electrode 13a and is thus interlaced with the first subsidiary row.

The interlaced row of information is moved through the parallel register C using, as mentioned above, a ripple clock system. Again a push-clock system is used so that, with every nth (for example every tenth) charge storage electrode of the ripple clock operated section of the parallel register C connected to the same clock line and similarly every nth (for example every tenth) charge transfer electrode is connected to the same clock line, simultaneously every nth (for example every tenth) row of information is moved one row down the parallel register C into the succeeding empty row by, with the clock signal on the clock line of the empty row high, first raising the clock signal on the clock line of the intervening charge transfer electrode to enable the charge packet to spread out into the potential wells of the empty row and then lowering the clock signal first on the charge storage electrode and then the intervening charge transfer electrode to push the charge packets along the channels 11 into the empty row. The clock signal of the charge storage electrode beneath which the row was previously then goes high (again after the clock signal on the clock line of the intervening charge transfer electrode has gone low to provide a barrier to back flow) and so becomes the empty row. The empty row thus moves back a row at a time towards the series input register A.

When an interlaced row of information is stored in potential wells formed at charge storage sites beneath the charge storage electrode Na, a high voltage signal is applied to the clock line $\phi_{24}$ of the first charge transfer electrode 24 of the de-interlacing output stage 20 and to the clock line $\phi_{21}$ of the first charge storage electrode 21 so enabling the charge packets to spread out under the charge storage electrode 21 and then, in a manner similar to that described above, the charge packets are pushed into potential wells beneath the first charge storage electrode 21 by first lowering the clock signal voltage on the clock line $\phi$Na of the charge storage electrode Na and then on the clock line $\phi_{24}$ which acts to provide a barrier to back flow of charge.

The charge packets of this interlaced row of information are now present in potential wells beneath the first charge storage electrode 21 with the second subsidiary row of information in potential wells beneath the teeth 21b and the first subsidiary row of information in potential wells defined by the intervening spine portions of the first charge storage electrode 21.

In order to effect de-interlacing, after the interlaced first and second subsidiary rows of information have been moved into potential wells beneath the second charge storage electrode with the clock signals applied on clock lines $\phi_{26}$ and $\phi_{27}$ to the third and fourth charge transfer electrodes 26 and 27 low blocking charge transfer and the clock signals applied on clock lines $\phi_{25}$ and $\phi_{28}$ to the second and fifth charge transfer electrodes 25 and 28 high (where the first subsidiary row is in potential wells defined within the first subsidiary group of channels 11a) or vice versa (where the first subsidiary row is in potential wells defined within the second subsidiary group of channels 11b) and with the clock signals on clock lines $\phi_{21}$ and $\phi_{23}$ high, the clock signal on clock line $\phi_{22}$ is caused to go low so that the first and second subsidiary rows are pushed in opposite directions with the second subsidiary row being pushed into potential wells beneath the first charge storage electrode 21 and the first subsidiary row into potential wells beneath the third charge storage electrode 23. The first subsidiary row may thus be output from potential wells beneath the third charge storage electrode 23 to the output series register B while the second subsidiary row is stored in potential wells beneath the first charge storage electrode 21.

Three possible schemes of clock pulses for carrying out the de-interlacing described above will now be discussed in detail, although it will be appreciated that many other arrangements or schemes may be possible.

Figure 7A:
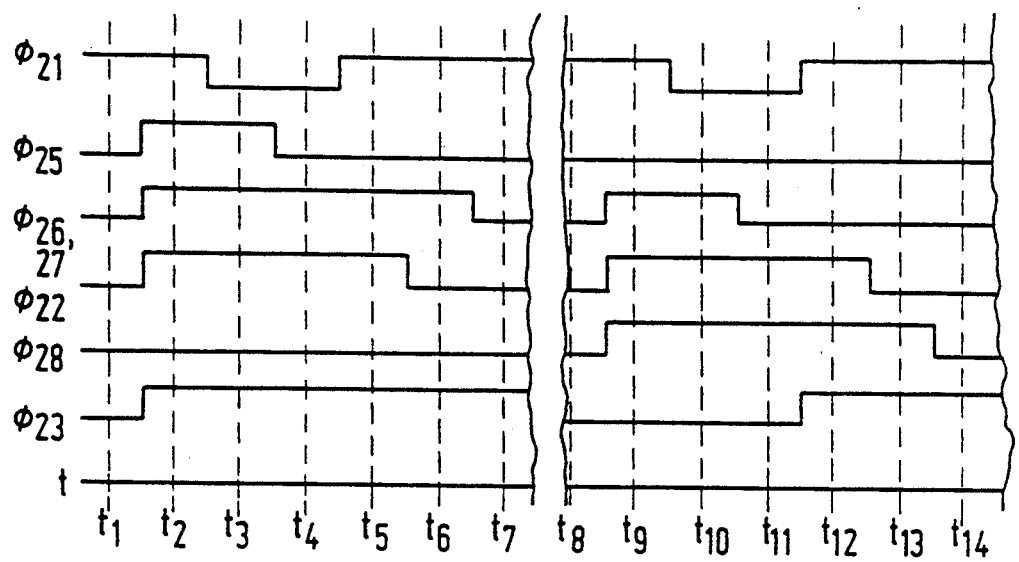
FIG. 7a is a timing diagram illustrating one scheme of clock signals for controlling operation of a de-interlacing output stage of a parallel section of the charge-coupled device shown in FIG. 2.
Figure 7B:
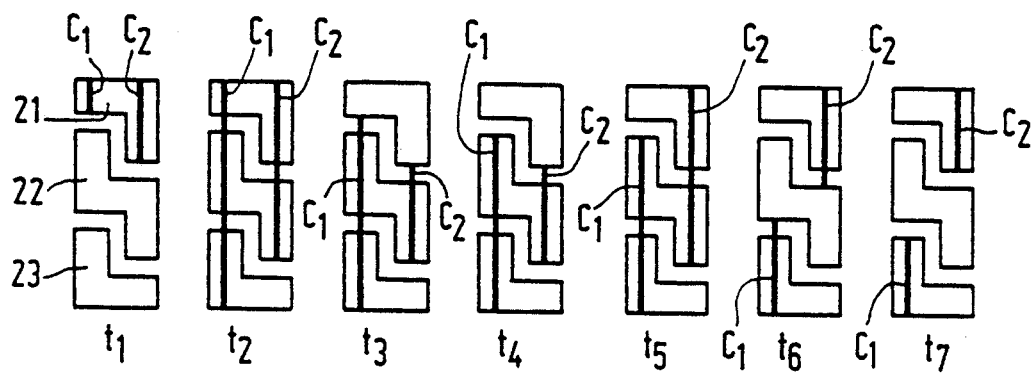
Figure 7B:
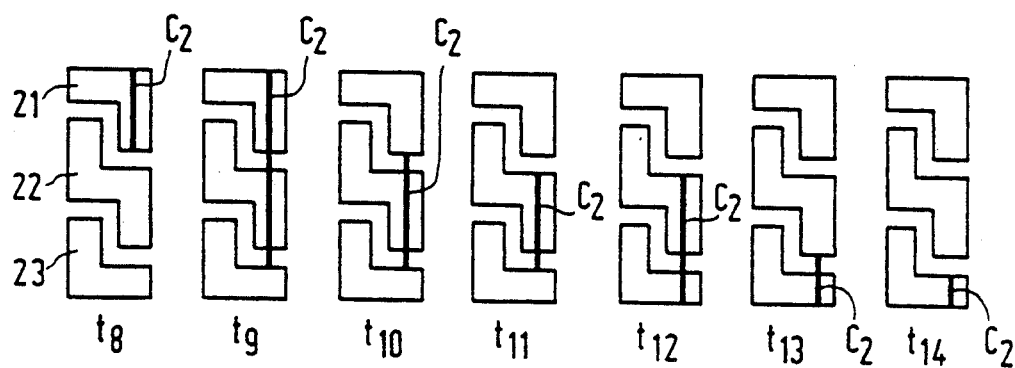

Referring firstly to FIGS. 7a to 7b, FIG. 7a is a timing diagram showing clock pulses on clock lines $\phi_{21}$ to $\phi_{28}$ for controlling separation of first and second subsidiary rows of information and for controlling transfer out of a second subsidiary row of information after output of the associated first subsidiary row.

FIG. 7b shows diagrammatic representations of the output stage 20 for a single pair of channels 11a and 11b and illustrates schematically the situation of respective charge packets C$_1$ and C$_2$ of the first and second subsidiary rows of information, respectively.

At time t$_1$ the clock signals on clock lines $\phi_{22}$ to $\phi_{28}$ are low (0 Volts in this example) while the clock signal on clock line $\phi_{21}$ is high. The charge packet $C_1$ is thus stored in a potential well defined by the spine 21a and the channel 11a while the charge packet $C_2$ is stored in a potential well defined by the tooth 21b and the channel 11b.

At time $t_2$, the voltages on clock lines $\phi_{22}$, $\phi_{23}$, $\phi_{25}$, $\phi_{26}$, and $\phi_{27}$ are raised high (5 volts in this example) and the charge packet $C_2$ thus spreads out into a potential well defined beneath the tooth 21b, charge transfer, electrode 26 and second charge storage electrode 22 while the charge packet $C_1$ spreads out into a potential well extending beneath all three charge storage electrodes 21, 22 and 23.

At time $t_3$, the voltage on clock line $\phi_{21}$ has gone low pushing the charge packets $C_1$ and $C_2$ out of the potential well beneath the first charge storage electrode 21.

The clock pulse on clock line $\phi_{25}$ then goes low at time $t_4$ so pushing the charge packet $C_1$ out of a potential well beneath the charge transfer electrode 25. At time $t_5$, the voltage on clock line $\phi_{21}$ again goes high enabling the charge packet $C_2$ to spread out under the tooth 21b. With the signals on clock lines $\phi_{21}$, $\phi_{23}$, $\phi_{26}$ and $\phi_{27}$ kept high and those on clock lines $\phi_{24}$, $\phi_{25}$ and $\phi_{28}$ kept low, the clock signal on clock line $\phi_{22}$ is brought low (time $t_6$) pushing both charge packets $C_1$ and $C_2$ out of the potential well beneath the second charge storage electrode 22. As the low voltage signals on clock lines $\phi_{25}$ and $\phi_{28}$ provide barriers to movement of the charge packets $C_1$ and $C_2$, respectively, charge packet $C_2$ is pushed to lie in a potential well beneath the tooth 21b and charge transfer electrode 26 while charge packet $C_1$ is pushed to lie in a potential well beneath the tooth 23b and the charge transfer electrode 27. At time $t_7$, the signals on clock lines $\phi_{26}$ and $\phi_{27}$ go low to push the charge packets $C_1$ and $C_2$ into wells beneath the teeth 23b and 21b, respectively.

The charge packet $C_1$ (and similarly the remaining charge packets making up the first row of information which have been moved simultaneously with the charge packet $C_1$) can then be moved into the series output register B by applying high voltage clock signals on clock lines $\phi_{T2}$ and $\phi_1^B$ and then subsequently lowering the voltage on clock line $\phi_{23}$ then on clock line $\phi_{T2}$ to push the charge packets into potential wells beneath charge storage electrodes 4'a of the series output register B.

The first subsidiary row of information is then output via the output connection or diode 10 under control of the push clock signals $\phi_1^B$ to $\phi_4^B$ which operate in a manner similar to the clock signals $\phi_1^A$ to $\phi_4^A$.

With the first subsidiary row output, the associated second subsidiary row may be transferred through the de-interlacing output stage 20 and via the output transfer gate $T_2$ to the series output register B. Thus, at time $t_8$, the charge packet $C_2$ lies in a potential well under the tooth 21b. At time $t_9$, the clock signals on clock lines $\phi_{22}$, $\phi_{26}$, and $\phi_{28}$ are raised high so that the charge packets $C_2$ spreads out into a potential well extending beneath charge storage electrode 22 and charge transfer electrode 28. By time $t_{10}$, the clock signal on clock line $\phi_{21}$ has gone low and at time $t_{11}$ the clock signal on clock line $\phi_{26}$ has gone low thus pushing the charge packet $C_2$ into a potential well underlying the second charge storage electrode 22 and the charge transfer electrode 28. By time $t_{12}$, the signal on clock line $\phi_{23}$ has gone high so allowing the charge packet $C_2$ to spread out into a potential well under the third charge storage electrode 23. By time $t_{13}$, the signal on clock line $\phi_{22}$ has gone low and by time $t_{14}$ the signal on clock line $\phi_{28}$ has gone low so pushing the charge packet $C_2$ completely into the potential well under the third charge storage electrode 23.

As all charge packets of the second subsidiary row of information are moved simultaneously through the de-interlacing output stage 20, the second subsidiary row is then present in potential wells beneath the third charge storage electrode and can be transferred in the manner described above for the first subsidiary row via the output transfer gate $T_2$ to potential wells beneath the charge storage electrodes 4"a of the series output register and can be output to the output connection 10 under the control of clock signals on clock lines $\phi_1^B$ to $\phi_4^B$ in a manner similar to the first subsidiary row.

In the arrangement described above with relation to FIGS. 7a and 7b, the clock signals on clock lines $\phi_{26}$ and $\phi_{27}$ are in synchronism and accordingly the charge transfer electrodes 26 and 27 may be connected to one clock signal.

Figure 8A:
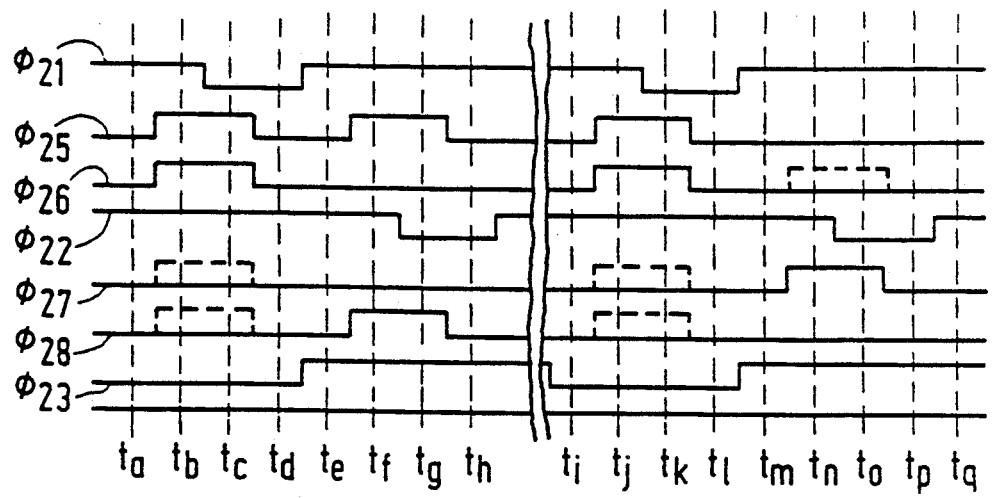
FIG. 8a is a timing diagram illustrating another scheme clock signal for controlling operation of a de-interlacing output stage of the parallel section of the charge-coupled device shown in FIG. 2.
Figure 8B:
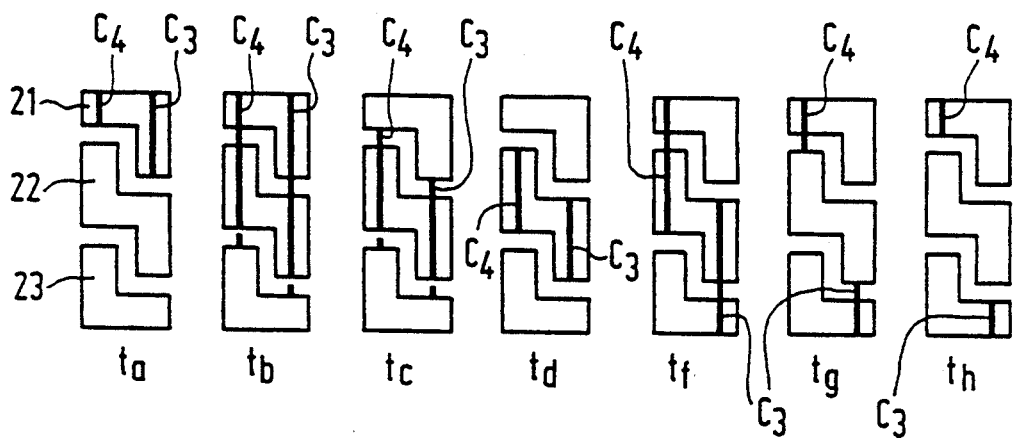
Figure 8B:
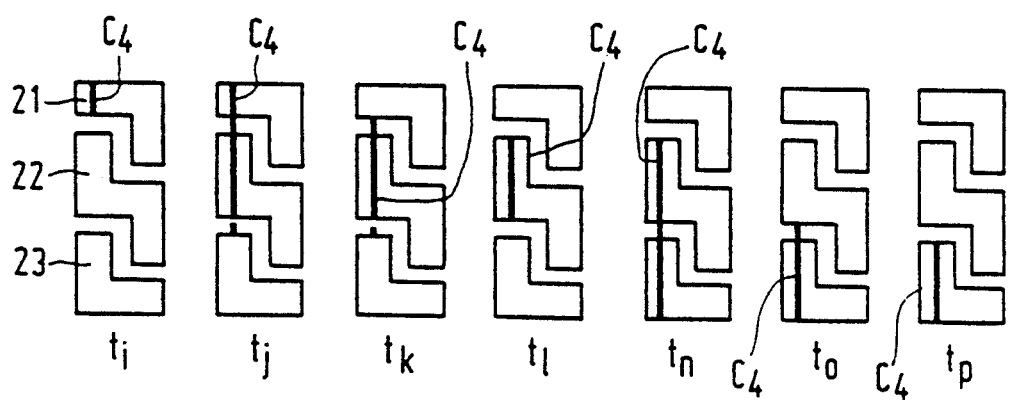

In the arrangement discussed with reference to FIGS. 7a and 7b, the subsidiary row of information to be output first is, upon entering the de-interlacing output stage 20, arranged to be in potential wells under the intervening portions of the spine 21a. However, the subsidiary row to be output first may lie under the teeth 21b. This may be achieved by either altering the clocking scheme for the series input register A so that the first and second subsidiary rows when input to the series input register A reside in potential wells beneath the charge storage electrodes 3"a and 3'a, respectively, or alternatively by altering the structure of the device so that the teeth 21b and 22c lie over the channels 11a and the teeth 22b and 23b over the channels 11b. FIGS. 8a and 8b illustrate an alternative method of effecting de-interlacing suitable for use in such a case although of course the clocking scheme illustrated by FIGS. 7a and 7b could be modified for use in such a case by transposing the clock signals applied to clock lines $\phi_{25}$ and $\phi_{26}$ and to clock lines $\phi_{27}$ and $\phi_{28}$ so that the clock signals shown in FIG. 7b for clock lines $\phi_{25}$, $\phi_{26}$, $\phi_{27}$ and $\phi_{28}$ are applied to charge transfer electrodes $\phi_{26}$, $\phi_{25}$, $\phi_{28}$ and $\phi_{27}$, respectively, and not as shown.

As illustrated in FIGS. 8a and 8b, at time $t_a$, charge packets $C_4$ and $C_3$ are, respectively, residing in potential wells beneath an intervening portion of the spine 21a and one of the adjacent teeth 21b. At this stage, the clock signals on clock lines $\phi_{23}$ to $\phi_{28}$ are low while those on clock lines $\phi_{21}$ and $\phi_{22}$ are high.

At time $t_b$, the signals on clock lines $\phi_{25}$ and $\phi_{26}$ have gone high enabling the charge packets $C_3$ and $C_4$ to spread out under the second charge storage electrode 22. As indicated by dashed lines in FIG. 8a, the clock signals on clock lines $\phi_{27}$ and $\phi_{28}$ may be synchronous with those on clock lines $\phi_{26}$ and $\phi_{25}$, respectively, enabling the charge transfer electrodes 25 and 28 to be connected to a common clock line and similarly enabling the charge transfer electrodes 26 and 27 to be connected to a common clock line. FIG. 8b indicates schematically by means of dashed lines that, if the signals on clock lines $\phi_{26}$ and $\phi_{27}$, and on clock lines $\phi_{25}$ and $\phi_{28}$, are the same, then the charge packets $C_4$ and $C_3$ spread out further to extend under the charge transfer electrodes 27 and 28, respectively.

At time $t_c$, the signal on clock line $\phi_{21}$ has gone low pushing the charge packets $C_3$ and $C_4$ out from under the first charge storage electrode 21 whilst at time $t_d$ the signals on clock lines $\phi_{25}$ and $\phi_{26}$ (and $\phi_{27}$ and $\phi_{28}$ if connected as mentioned above) have gone low so that the charge packets $C_3$ and $C_4$ reside, as shown in FIG. 8b, under the second charge storage electrode 22.

By the time $t_e$, the signals on clock lines $\phi_{21}$ and $\phi_{23}$ have gone high (not shown in FIG. 8b) and subsequently by time $t_f$ the signals on clock lines $\phi_{25}$ and $\phi_{28}$ have gone high allowing the charge packet $C_3$ to spread out under the spine 23a and the charge packet $C_4$ to spread out under the spine 21a.

Next, as indicated by the situation at time $t_g$, the signal on clock line $\phi_{22}$ goes low pushing the charge packets out from under the second charge storage electrode 22. By time $t_h$ the signals on clock lines $\phi_{28}$ and $\phi_{25}$ have also gone low so that the charge packets $C_3$ and $C_4$ are pushed into potential wells under the spines 23a and 21a, respectively. The clock signal on clock line $\phi_{22}$ then returns to its high position.

The first subsidiary row of information (which includes the charge packet $C_3$) may then be output as described above by first applying a high clock signal on clock line $\phi_{T2}$ and transferring the charge packets to potential wells beneath the charge storage electrodes 4"a and transporting the charge packets to the output connection 10 under the control of the clock signals $\phi_1^B$ to $\phi_4^B$.

After the first subsidiary row has been output, the second subsidiary row may be transferred through the de-interlacing output stage 20. Thus, at time $t_i$, clock signals on clock lines $\phi_{21}$ and $\phi_{22}$ are high and the signals on clock lines $\phi_{23}$ to $\phi_{28}$ are low and the charge packet $C_4$ resides in the potential well under the spine 21a. By the time $t_j$, the signals on clock lines $\phi_{26}$ and $\phi_{25}$ (and $\phi_{27}$ and $\phi_{28}$ if connected to clock lines $\phi_{26}$ and $\phi_{25}$, respectively) have gone high enabling the charge packet $C_4$ to spread out to extend under the second charge storage electrode 22 (plus to under the charge transfer electrode 28 as indicated in dashed lines if $\phi_{25}$ and $\phi_{28}$ are connected). By the time $t_k$ the signal on clock line $\phi_{21}$ has gone low, pushing the charge packet out of the potential well under the first charge storage electrode 21 and by time $t_l$, the signals on clock lines $\phi_{25}$ and $\phi_{26}$ have gone low so that the charge packet $C_4$ resides under the second charge storage electrode 22.

By time $t_m$ (not shown in FIG. 8b) the signals on clock lines $\phi_{21}$ and $\phi_{23}$ have gone high and by time $t_n$, the signals on clock lines $\phi_{26}$ (if connected to clock line $\phi_{27}$) and $\phi_{27}$ have gone high so that the charge packet $C_4$ spreads out to extend under the third charge storage electrode 23. At time $t_o$ the clock signal on clock line $\phi_{22}$ goes low and at time $t_p$ the clock signal on clock line $\phi_{27}$ (and $\phi_{26}$ if connected to $\phi_{27}$) goes low so pushing the charge packet $C_4$ out from under the second charge storage electrode 22. By time $t_q$ (not shown in FIG. 8b) the clock signal on $\phi_{22}$ has gone high again and the charge packet $C_4$ is stored under the third charge storage electrode 23 (as are the other charge packets of the second subsidiary row) and may be output as described above first into potential wells under charge storage electrodes 4'a under control of signals on clock line $\phi_{T2}$ and then to the output connection 10 under control of clock signals on clock lines $\phi_1^B$ to $\phi_4^B$.

Figure 9A:
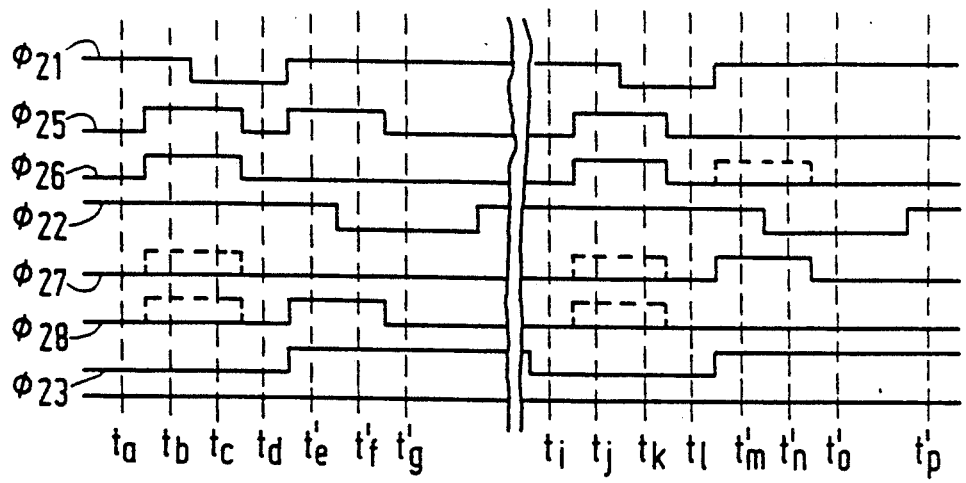
FIG. 9a is a timing diagram illustrating a modified version of the clock signal scheme shown in FIG. 8a for controlling operation of the de-interlacing output stage.
Figure 9B:
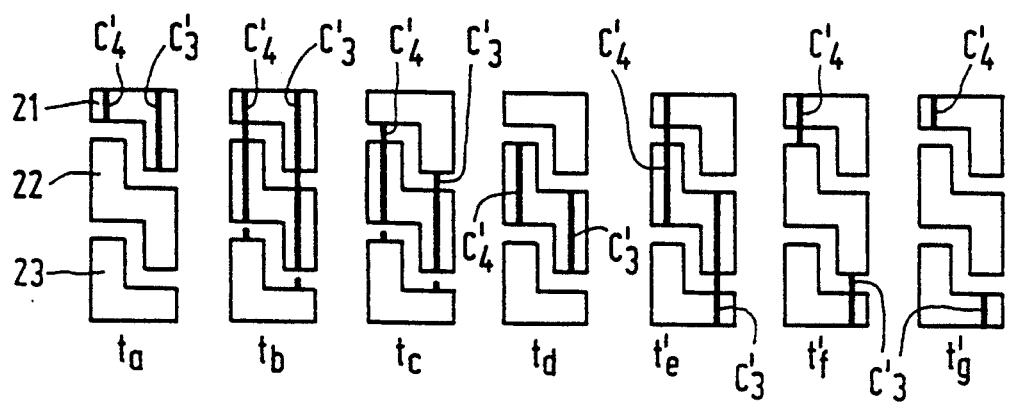
Figure 9B:
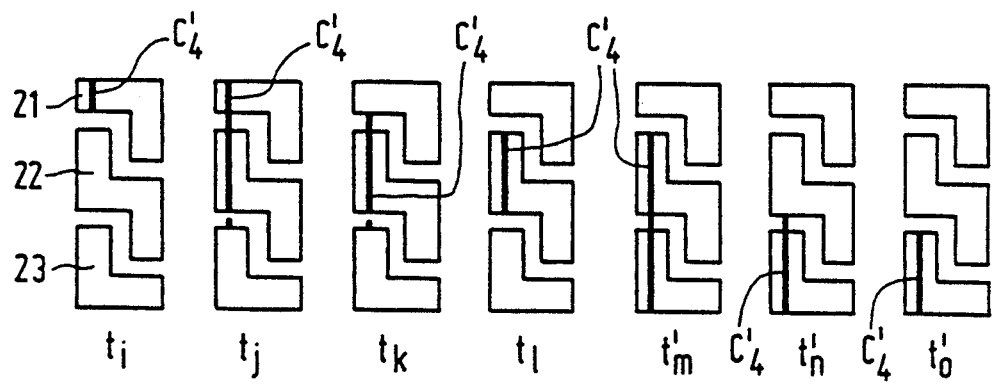

FIGS. 9a and 9b illustrate a modified version of the clocking scheme shown in FIGS. 8a and 8b in which at time $t_a$ charge packets $C'_4$ and $C'_3$ are residing, respectively, in potential wells beneath an intervening portion of the spine 21a and one of the adjacent teeth 21b.

As will be appreciated from a comparison of FIGS. 8a and 9a and of FIGS. 8b and 9b, the clocking scheme shown in FIGS. 9a and 9b is very similar to that of FIGS. 8a and 8b and therefore only the differences will be highlighted here.

Thus, up to time $t_d$, the clocking scheme shown in FIGS. 9a and 9b proceeds in the same manner as the clocking scheme of FIGS. 8a and 8b so that the charge packets $C_4'$ and $C_3'$ both reside in potential wells beneath the second charge storage electrode.

At time $t'_e$, however, the clock signals on clock lines $\phi_{21}$, $\phi_{25}$, $\phi_{23}$ and $\phi_{28}$ have gone high whilst the clock signals on clock lines $\phi_{26}$ and $\phi_{27}$ remain low, so that the charge packet $C_4'$ spreads out to extend under the intervening portion of the spine 21a and the charge packet $C_3'$ spreads out to extend under the intervening portion of the spine 23a (the situation at time $t_f$ in FIG. 8a).

By the time $t'_f$, the clock signals on clock line $\phi_{22}$ has gone low so pushing the charge packets $C_3'$ and $C_4'$ into potential wells beneath the fifth charge transfer electrode 28 and the intervening portion of the spine 23a and beneath the second charge transfer electrode 25 and the intervening portion of the spine 21a, respectively (the situation at time $t_g$ in FIG. 8b). Subsequently by time $t'_g$, the clock signals on clock lines $\phi_{28}$ and $\phi_{25}$ have also gone low so that the charge packets $C_3'$ and $C_4'$ are pushed into potential wells under the spines 23a and 21a, respectively (the situation at time $t_h$ in FIG. 8b). The clock signal on clock line $\phi_{22}$ then returns to its high position.

The first subsidiary row of information can then be output as described above and subsequently the second subsidiary row can be output. As can be seen from a comparison of FIGS. 8a and 9a and of FIGS. 8b and 9b, from time $t_i$ to time $t_l$ the clocking signals applied in the modified clocking scheme shown in FIGS. 9a and 9b are the same as those shown in FIGS. 8a and 8b.

By time $t'_m$, however, the signals on clock lines $\phi_{21}$, $\phi_{23}$, $\phi_{26}$ (if connected to clock line $\phi_{27}$) and $\phi_{27}$ have gone high so that the charge packet $C_4$ spreads out to extend under the third charge storage electrode 23 (the situation at time $t_n$ in FIGS. 8a and 8b). At time $t'_n$ (the situation at time $t_o$ in FIGS. 8a and 8b) the clock signal on clock line $\phi_{22}$ has gone low and at time $t'_o$ the clock signal on clock line $\phi_{27}$ (and $\phi_{26}$ if connected to $\phi_{27}$) has gone low so pushing the charge packet $C_4$ out from under the second charge storage electrode 22 (the situation at time $t_p$ in FIGS. 8a and 8b). The clock signal on clock line $\phi_{22}$ has gone high again by time $t'_p$ (the situation at time $t_q$ in FIGS. 8a and 8b) and the charge packet $C_4$ is stored under the third charge storage electrode 23 (as are the other charge packets of the second subsidiary row) and may be output as described above first into potential wells under charge storage electrodes 4'a under control of signals on clock line $\phi_{T2}$ and then to the output connection 10 under control of clock signals on clock lines $\phi_1^B$ to $\phi_4^B$.

As for the case of the clocking scheme of FIGS. 7a and 7b, in the clocking scheme of FIGS. 8a and 8b and the modified scheme of FIGS. 9a and 9b, the clock signals applied to the clock lines $\phi_{25}$ and $\phi_{26}$ and to the clock lines $\phi_{28}$ and $\phi_{27}$ could be reversed so that the clock signals shown in FIG. 9b for clock lines $\phi_{25}$, $\phi_{26}$, $\phi_{27}$ and $\phi_{28}$ are instead applied to the charge transfer electrodes 26, 25, 28 and 27, respectively, and the charge packet $C_4$ can then be output first.

As will be appreciated from a consideration of FIGS. 8a to 9b, the clocking scheme shown in FIGS. 9a and 9b requires fewer clocking signal changes than that shown in FIGS. 8a and 8b and moreover, where possible, the signals on clock lines change at the same time (see for example the clock signal change to produce the situation at time t'e). This reduces the complexity of the clocking scheme and moreover may help to reduce undesired capacitance and avalanche effects which may be caused by frequent voltage changes on the clock lines.

Although in the arrangements described above, the charge packets of the second subsidiary row remain under the first charge storage electrode 21 during output of the first subsidiary row from the output series register B, these charge packets may be moved under the control of appropriate clock signals to reside at least under the second charge storage electrode 22 with the succeeding charge transfer electrode 28 and the third charge storage electrode 23 providing a sufficient barrier to cross-talk with the series output register B. The second subsidiary row may even be moved to lie under the third charge storage electrode 23, especially if a buffer arrangement is provided between the de-interlacing output stage 20 and the output transfer gate as described in, for example, GB-A No.2110874.

Further, although in the arrangements described above with reference to FIGS. 7a to 9b, the clock signal on clock line $\phi_{24}$ is maintained low to provide a barrier to a subsequent interlaced row of information entering the de-interlacing output stage 20 before the second subsidiary row of the row being de-interlaced has been output to the output connection 10, it may be possible to allow the subsequent interlaced row of information to be input to lie in potential wells under the first charge storage electrode 21 when the second subsidiary row of information of the preceding row is still in the situation indicated at time $t_{13}$ or $t_{14}$ (or even $t_{12}$) in FIGS. 7a and 7b or in the situation indicated at time $t_o$ (or even at time $t_m$ if the voltage applied to charge storage electrode 21 is high) in FIGS. 8a and 8b. Normally, however, the clocking speed for the de-interlacing output stage will be adjusted so that by the time the next interlaced row of interlaced row of information is present beneath the charge storage electrode Na, the second subsidiary row of the preceding row will have been output to the output connection 10.

Of course if it is not desired for the information to be output in the same order as it was input, the second subsidiary row could be output before the first. Similarly, each tooth might extend over two or more adjacent channels and each tooth may be a composite tooth enabling each channel to be associated with its own controlling charge transfer electrode.

Although the arrangement described above uses a four phase clocking arrangement, other clocking systems may be used. Furthermore, although the arrangement described above uses a push-clock clocking system, a charge-coupled device embodying the invention may be operated with a drop-clock clocking system and with implanted p+ barriers under the charge transfer electrodes to provide asymmetry in the potential beneath the charge storage and charge transfer electrodes.

Although in the arrangement described above, surface channel charge-coupled device structures are used, buried channel type charge-coupled device structures may also be used. Also, although the arrangement described above refers to serial-parallel-serial memories, the invention may be used in similar devices, for example in image sensors. Furthermore the invention may also be applicable where the semiconductor body is of n conductivity type, although appropriate changes to the voltages of the clock signals would be required. Similarly, the invention may be applicable where the semiconductor body is formed of a semiconductor material other than silicon, with appropriate consideration being given to the different properties of the semiconductor body and where the charge storage and charge transfer electrodes are formed of a conductive material or a composite of layers of different conductive material other than doped polycrystalline silicon.

From reading the present disclosure, other modifications will be apparent to persons skilled in the art. Such modifications may involve other features which are already known in the design of charge-coupled devices and which may be used instead of or in addition to feature already described herein.

What is claimed is:

1. A charge-coupled device comprising a semiconductor body having a plurality of parallel charge conduction channels, charge storage electrodes extending across the channels so that each charge storage electrode defines with the channels a respective row of charge storage sites, and charge transfer electrodes extending across the channels for transferring charge packets between rows of charge storage sites, which device comprises a first charge storage electrode having a first row of teeth overlying one subsidiary group of the channels, a second charge storage electrode having second and third rows of teeth, the second row being interdigitated with the first row so as to overlie an other subsidiary group of the channels, a third charge storage electrode having a fourth row of teeth interdigitated with the third row of teeth, one of the third and fourth rows of teeth overlying the said one subsidiary group of channels and the other of the third and fourth rows of teeth overlying the said other subsidiary group of channels, a first charge transfer electrode for transferring charge packets to the row of charge storage sites defined by the channels and the first charge storage electrode, a second charge transfer electrode for transferring charge packets between charge storage sites beneath the first charge storage electrode and charge storage sites beneath the second row of teeth, a third charge transfer electrode for transferring charge packets between charge storage sites beneath the first row of teeth and charge storage sites beneath the second charge storage electrodes, a fourth charge transfer electrode for transferring charge packets between charge storage sites beneath the second charge storage electrodes and charge storage sites beneath the fourth row of teeth and a fifth charge transfer electrode for transferring charge packets between charge storage sites beneath the third row of teeth and charge storage sites beneath the third charge storage electrode.

2. A charge-coupled device according to claim 1, wherein the third row of teeth are offset from the second row of teeth so that the teeth of the third row overlie the said one subsidiary group of channels and the teeth of the fourth row overlie the said other subsidiary group of channels.

3. A charge-coupled device according to claim 1 or 2, wherein each tooth overlies a single channel.

4. A charge-coupled device according to claim 1 or 2, wherein the said one subsidiary group of channels is formed by alternate ones of the channels and the said other subsidiary group of channels by the remaining channels.

5. A charge-coupled device according to claim 1 or 2, which comprises a parallel register defined by the channels and charge storage and transfer electrodes extending transversely over the channels, and a series output register comprising a further channel and further charge storage and transfer electrodes, each further charge storage electrode of the series output register being associated with a channel of the parallel register, wherein the first, second and third charge storage electrodes and associated charge transfer electrodes form an output stage of the parallel register, an output transfer gate being provided for transferring charge packets from charge storage sites beneath the third charge storage electrode to the series output register.

6. A charge-coupled device according to claim 5, which comprises a series input register having a channel and associated charge storage and transfer electrodes, each charge storage electrode of the series input register being associated with a channel of the parallel register, and an input transfer gate for transferring charge packets from the series input register to the parallel register.

7. A charge-coupled device according to claim 5, wherein or each of the series input and output registers is a four-phase register.

* * * * *